(12) United States Patent
Holderer et al.

(10) Patent No.: US 6,229,657 B1
(45) Date of Patent: May 8, 2001

(54) ASSEMBLY OF OPTICAL ELEMENT AND MOUNT

(75) Inventors: Hubert Holderer, Königsbronn; Peter Rümmer, Oberkochen; Michael Trunz, Ellwangen, all of (DE)

(73) Assignee: Carl-Zeiss-Stiftung (DE)

( * ) Notice: Subject to any disclaimer, the term of this patent is extended or adjusted under 35 U.S.C. 154(b) by 0 days.

(21) Appl. No.: 09/328,938

(22) Filed: Jun. 9, 1999

(30) Foreign Application Priority Data

Jun. 9, 1998 (DE) .............................................. 198 25 716

(51) Int. Cl.$^7$ ....................................................... G02B 7/02
(52) U.S. Cl. ............................ 359/822; 359/823; 359/819
(58) Field of Search ...................... 359/819–826

(56) References Cited

U.S. PATENT DOCUMENTS

| 5,428,482 | 6/1995 | Bruning et al. | 359/827 |
| 5,523,893 | 6/1996 | Haas | 359/820 |
| 5,555,480 | * 9/1996 | Tanaka | 359/822 |
| 5,991,101 | 11/1999 | Holderer et al. | 359/819 |

FOREIGN PATENT DOCUMENTS

| 31 16579 A1 | 4/1981 | (DE) . | |
| 37 14745 A1 | 5/1987 | (DE) . | |
| 197 48 211 | 5/1999 | (DE) . | |
| 0 053 463 | 11/1981 | (EP) | G02B/7/18 |
| 0 053 463 A2 | 11/1981 | (EP) . | |
| 0 145 902 | 10/1983 | (EP) | H01L/21/308 |

OTHER PUBLICATIONS

Patent Abstract of Japan; Publication No. 60230609; Application Date Jan. 5, 1984: Konishiroku Photo Ind Ltd.
Patent Abstract of Japan; Publication No. 10026736; Application Date Oct. 7, 1996; Kodaira Takashi.
European Search Report Dated Oct. 20, 1999 EP 99110271.
Neue Werkstoffverbunde durch Ultraschall–schweissen. technologie & management. pp. 31–39 Erwin Roeder, Guntram Wagner, & Jochen Wagner, 1995. English Translation in not readily available.

* cited by examiner

*Primary Examiner*—Georgia Epps
*Assistant Examiner*—Michael A Lucas

(57) ABSTRACT

Assembly of an optical element and a mount, in which the optical element is coupled by means of numerous lugs to a rigid intermediate ring, which itself is coupled by adjusting members or passive decouplers to the mount for connection to a housing and/or to a further mount.

37 Claims, 4 Drawing Sheets

ASSEMBLY OF OPTICAL ELEMENT AND MOUNT

STATEMENT REGARDING FEDERALLY SPONSORED RESEARCH OR DEVELOPMENT

Not applicable.

CROSS-REFERENCES TO RELATED APPLICATIONS

Not Applicable.

BACKGROUND OF THE INVENTION

1. Field of the Invention

The invention relates to an assembly of optical element and mount, the use of such an assembly, an objective therewith and a projection exposure device for microlithography therewith. Optical components, such as lenses, prisms, mirrors, gratings, consisting usually of glass, crystal or ceramic, are regularly assembled by means of mounts, as a rule of metal, to give optical assemblies, for example, objectives.

The optical elements are then to be positioned while maintaining close tolerances relative to one another, and the whole assembly is to have a certain robustness against external influences. Particular requirements are then set both for astronomical telescopes, such as those in satellite-borne systems (for example, the ROSAT X-ray telescope), and in projection exposure systems for microlithography.

European Patent EP 0 053 463 teaches the suspension of precision mirrors on leaf spring elements, which are cemented.

A highly developed mounting technology for lenses of microlithographic projection objectives is also described in U.S. Pat. No. 5,428,482.

Either the lens is directly cemented with three radial bending beams, or an intermediate ring is connected to the outer mount ring by means of three monolithic joints evenly distributed on the periphery. Full-surface cementing of the lens and intermediate ring is provided. An optical assembly, in particular an objective, is then built up by stacking the mount rings.

Arrangements with actuators for the displacement or deformation of optical elements relative to the basic mount part are known in many embodiments. An example is provided by European Patent EP 0 145 902 A, where a mirror is suspended on a mount by means of three tangential spokes whose length can be varied by means of Peltier elements.

SUMMARY OF THE INVENTION

The invention has as its object the provision of an assembly of optical element and mount, in which the accuracy of positioning of the optical element and its decoupling from external effects acting on the mount are increased. The joint place between the optical element and mount, that is, a glass-metal or crystal-metal connection as a rule, is at the same time to be relieved of requirements for geometrical precision, so as to make it accessible for other jointing processes such as adhesion, particularly for the increase of DUV resistance.

The inventive solution is to cover as a construction principle a great bandwidth of cases of application. The integration into an objective and the use in a microlithography projection exposure device is provided, with particular suitability for very sensitive adjustment of its imaging power.

This object is attained by means of an assembly of optical element, a mount, a plurality of lugs, a rigid intermediate ring, adjusting members or passive decouplers, and a housing. The optical element is coupled by the lugs to the rigid intermediate ring. The rigid intermediate ring is connected by the adjusting members or the passive decouplers to the mount for connection to the housing or further mounts. In which the optical element is coupled by numerous lugs to a rigid intermediate ring, which is further connected via active adjusting members or passive decouplers to a mount which is to be connected to a housing and/or to further mounts.

The lugs are embodied as spring links or leaf springs. The different thermal expansion of the optical element (e.g., glass) and the mount (metal) is thereby substantially taken up. Altogether, stresses are minimized.

The connection of the optical element with the lugs is concerned to insure stability to the radiation which acts on the optical element (which is a problem in the UV region), and likewise not to build up any stresses in the optical element, as is unavoidable with positive connections (clamping). Material connections, e.g. metallic welded or soldered connections are therefore preferred.

This similarly holds for the connection of the lugs to the intermediate ring; here also, the homogeneous integral one-piece embodiment of the lugs and the intermediate ring is possible and in many cases is meaningful. However, where position tolerances of the lugs in the connection to the optical element are to be equalized, jointing to the intermediate ring, e.g. by laser welding is advantageous.

Piezoelements, or else Peltier elements (as in European Patent EP 0 145 902 A), are suitable driving means for the active adjusting members, which can in addition include suitable mechanisms (monolithic levers and joints).

Monolithic joints and mechanisms are principally suitable for the passive decouplers, somewhat corresponding to U.S. Pat. No. 5,428,482.

An important class of optical elements are those provided, with a rotationally symmetrical edge with a symmetry axis. This particularly includes the classic lenses with a cylindrical edge, certainly also with non-spherical and non-centered optical surfaces.

Advantageous embodiments of the intermediate ring and the lugs are realized in which the intermediate ring is rotationally symmetrical with respect to the symmetry axis. The lugs are arranged symmetrically with respect to the planes (E) containing the symmetry axis, and uniformly distributed over the periphery of the optical axis.

Particularly advantageous embodiments are possible regarding the arrangement of lugs. The optical element has a main plane that intersects the edge of the optical element with a closed curve (closed contour or closed loop). The lugs can be arranged substantially perpendicularly to the main plane. Or the lugs can be arranged substantially in the main plane radially of the edge of the optical element. According to this, the lugs are arranged like spokes between the "hub" represented by the optical element and the "rim" of the intermediate ring.

The lugs can also be arranged tangentially, similarly to the beams of U.S. Pat. No. 5,428,482.

An important advantage of the arrangement according to the invention, which with its many free constructional parameters makes quite possible the setting of a lowest characteristic frequency of mechanical vibrations greater than 200–400 Hz, (preferably greater than 300 Hz up to 1 K Hz). The disturbing vibration excitations which are present substantially at lower frequencies are thereby effectively suppressed.

High qualities of the stress-free mounting are attainable with the invention. Astigmatic or three-waviness residual lens deformations under 30 nm, down to under 20 nm, are attained. The deformations of the seating surface of the outer ring are decoupled from the lens to the extent of over 95%, preferably over 98% and in optimum constructions to over 99%.

Passive adjusting members are provided are particularly suitable for the adjustment of the lens to a reference outside the objective and within the objective.

In their preferred use, the assemblies are in objectives and projection exposure devices for microlithography, wherein tieing into a control circuit that drives the actuators makes possible the correction of extremely fine disturbances.

BRIEF DESCRIPTION OF THE DRAWINGS

The invention is described in more detail with reference to the drawings, in which.

DETAILED DESCRIPTION OF PREFERRED EMBODIMENTS

Figure 1:
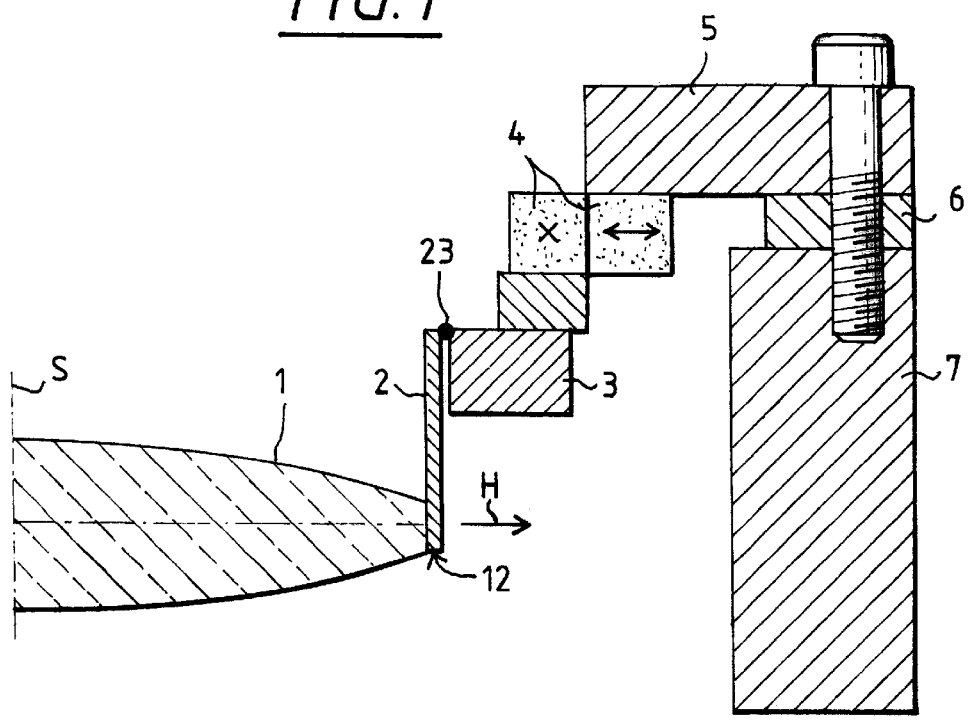
FIG. 1 shows a schematic section through the arrangement according to the invention with suspending lugs and actuator.

The arrangement shown in FIG. 1 has a lens 1 and a mount 5. According to the invention, a more rigid intermediate ring 3, preferably a stainless steel ring of (by order of magnitude) 1 cm$^2$ cross section depending on the mass and rigidity of the lens is provided, and is connected to the lens 1 by lugs 2 and to the mount 5 by actuators 4. The mount is connected by means of an intermediate layer 6, which permits exact height adjustment, to a housing 7 which is embodied, e.g., as a spacer ring to a further such mounted lens.

The connection 12 of the lens 1 to the lug 2 presents problems for two reasons.

Firstly, problems arise from the pairing of materials by the different properties of the optical element 1 of glass, crystal such as CaF$_2$ or quartz, or of glass ceramic (Zerodur (R) mirror) and the metal lugs 2 of stainless steel, spring bronze, or the like during welding, soldering, or also during screwing or riveting.

Secondly, this joint place is exposed to radiation which the optical element transports, with the exception of mirrors. During use in the deep UV spectral region (about 300–100 nm wavelength), this leads to complete unusability of organic adhesives, since these are destroyed by the radiation.

In addition this connection 12 is to be carried out with very close geometric tolerances, in order to attain the purpose of the arrangement.

Furthermore the optical elements 1 are sensitive to thermal loading, since for example antireflective coatings cannot withstand temperatures much over 100° C., and on the other hand glasses and in particular crystals such as CaF$_2$, which because of its DUV transparency is required as a partner to quartz glass for achromatized optics, are sensitive to temporal and spatial temperature gradients.

In the embodiment, the connection 12 is produced by ultrasonic welding, as is known, for example, from E. Röder et al., Technologie & Management 44 (1995), pages 31–39, whereby the abovementioned problems can be overcome. Another possible jointing technique is soldering with low-melting solders as shown in German Patent Application DE 197 55 356. Position tolerances of the lugs 2 can be compensated by the coupling 23 that couples the lugs to the rigid intermediate ring 3 when this is subsequently effected. Laser welding has been found to be suitable for this, and very uniform welded joints are thereby attained with little heat input.

The lugs 2 are precisely formed as leaf spring elements of sheet metal by stamping or etching. They are typically 0.1–0.5 mm thick, about 3–20 mm wide, and 10–30 mm long, with a distance of a few mm. In the embodiment, they are parallel to the optical axis and symmetry axis of the lens 1.

Figure 7:
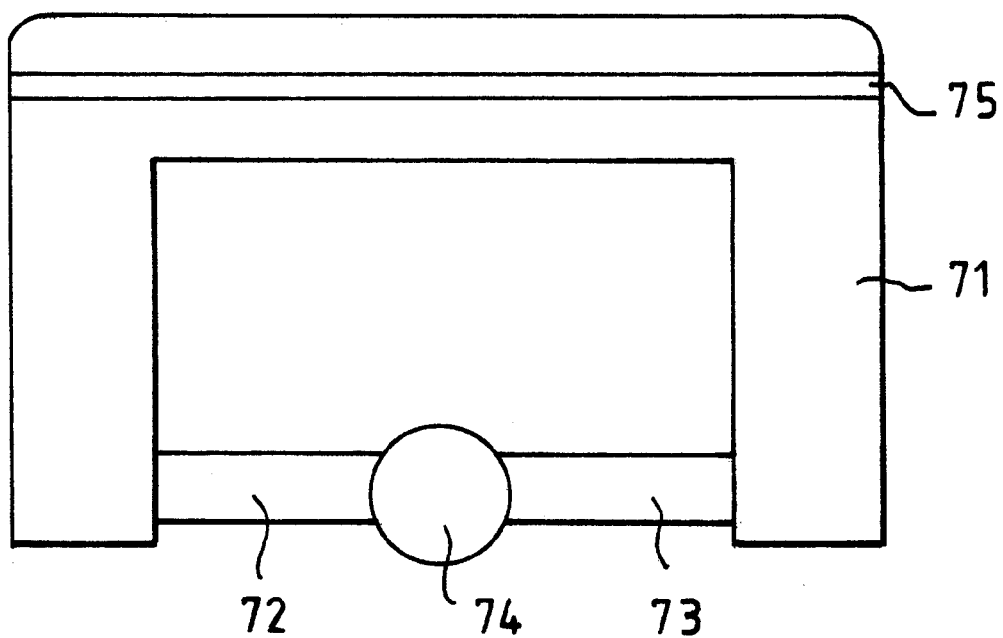
FIG. 7 shows a preferred spring lug schematically.

In an embodiment according to FIG. 7, an etched or stamped part with a rigid yoke 71, two tangential leaf spring elements 72, 73 and a zone 74 for ultrasonic welding with the lens therebetween provides the opportunity for moment-free radial expansion of the lens. The laser welding zone for the connection with the intermediate ring is denoted by 75.

The rigid intermediate ring 3 is connected to the mount 5 by means of actuators 4 at, for example, three places evenly distributed over the periphery. The actuators 4 are constructed from piezoelectric elements, for example. By this arrangement, two degrees of freedom of the lens, namely tilting around the x- and y-axes perpendicular to the symmetry axis, are decoupled with respect to the mount 5.

Passive actuators which are required only during adjustment of the objective can also be effected by set screws.

This makes possible, on the one hand, an adjustment of lens tilting, and on the other hand decouples deformations of the mount 5 which arise from their manufacturing tolerances during assembly of the mounts 5, intermediate spacers 6 and housing 7 to complete optical systems (e.g., objectives).

Figure 2:
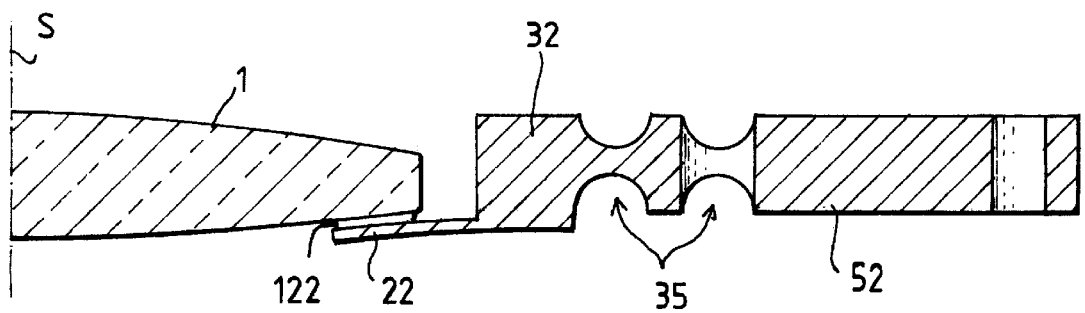
FIG. 2 shows a schematic section through the arrangement according to the invention with horizontal lugs and monolithic joint between intermediate ring and mount.

FIG. 2 shows a variant, in a corresponding illustration. Here the lens 1 is connected to the lug 22 by an adhesion place 122 with the lug 22. The radiation resistance of the adhesive is insured by the use of an adhesive protection layer according to German Patent Application DE 197 48 211. The known methods of alignment-cementing make possible a very exact adjustment.

The lugs 22 united with the rigid ring 32 are made in one piece; for example, in addition to precision turning, erosion is used in order to introduce the separations between the lugs 2. The rigid ring is decoupled from the mount 52 by monolithic joints 35, so that their deformations in the assembled state cannot affect the lens 1.

The relationship of typical dimensions are the same as in FIG. 2.

Figure 3:
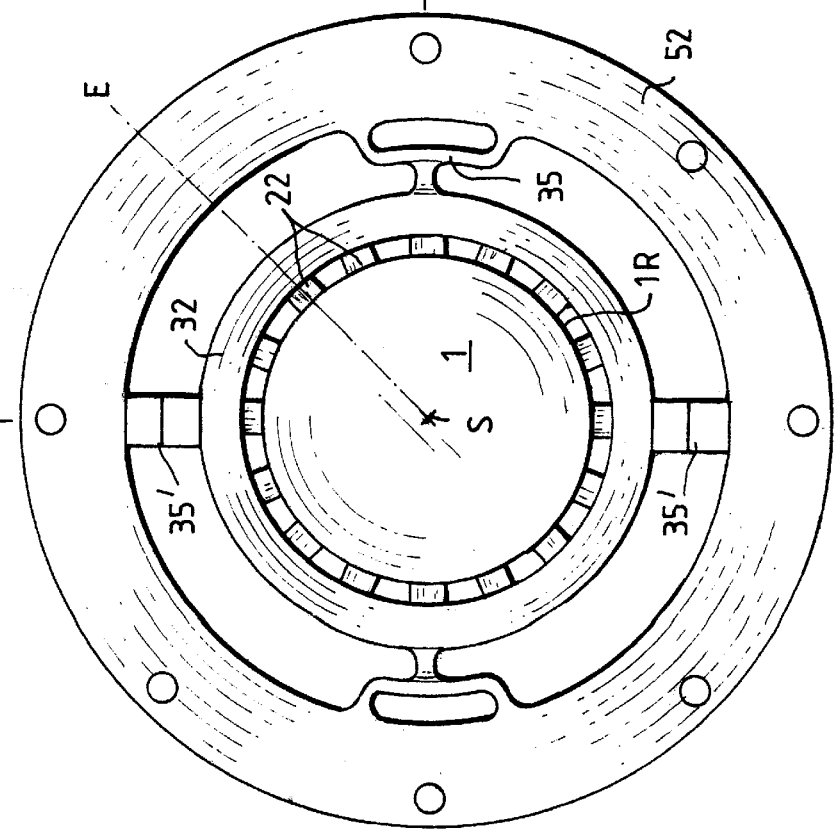
FIG. 3 shows a top view of an arrangement of the kind shown in FIG. 2.

FIG. 3 shows a view, in the direction of the optical axis and symmetry axis S, of the arrangement which was shown in cross section in FIG. 2. It can be seen that the lugs 22 are arranged radially and are respectively constructed symmetrically with respect to a plane E which contains the symmetry axis S. Also, the optical element 1 (lens) has an edge 1R which is rotationally symmetrical with respect to the symmetry axis S; the intermediate ring 32 is a ring which is rotationally symmetrical with respect to the symmetry axis S, and the lugs are uniformly distributed over the periphery. Respective spring links 35, 35' are situated on the X-axis and the Y-axis; their mobility is differently oriented respectively pairwise. The designer of the mount chooses the number, position and mobility according to the given requirements. Also, the mount 52 is cylindrical, as is generally the case for lens mounts.

Figure 4:
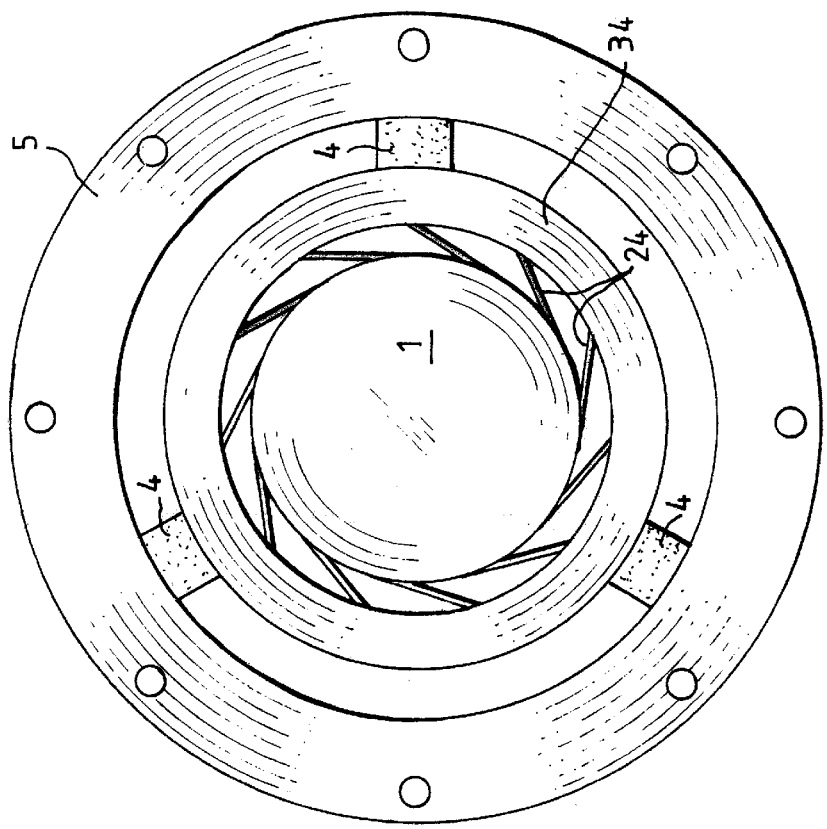
FIG. 4 shows a top view of an arrangement according to the invention with tangential lugs.

FIG. 4 shows, in a like top view, an arrangement according to the invention with lugs 24 engaging the lens tangentially and perpendicular to the plane of the drawing and thus perpendicular to the main plane X, Y with x- and y-axes (as are also the suspending lugs of FIG. 1). The intermediate ring 34 is connected to the mount 5 by means of three actuators 4 of the kind described in connection with FIG. 1, arranged at 120°.

The arrangement according to the invention is of course suitable, not only for rotationally symmetrical lenses, but also for any kind of optical element such as prisms, mirrors, gratings, holographic elements and the like, of any shape. It is noteworthy that this mounting technique is suitable for arbitrary positioning of the optical element relative to gravity.

Figure 5:
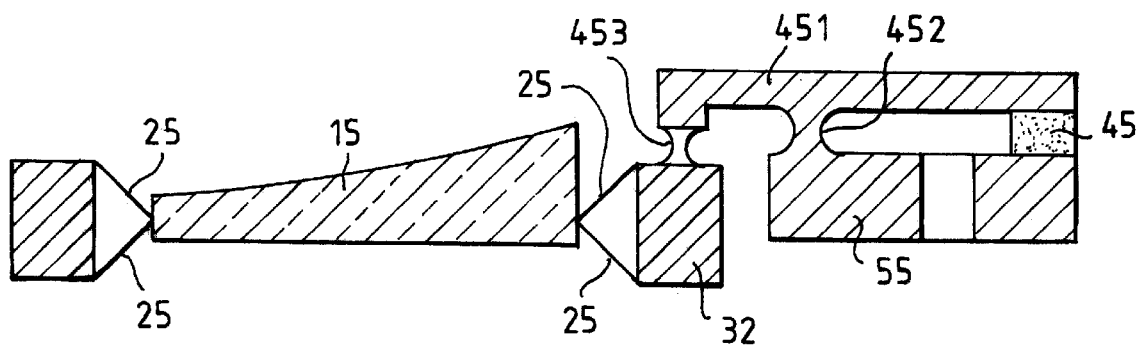
FIG. 5 shows a schematic section through an arrangement according to the invention with mirror and actuator with lever mechanism.

As a further embodiment, FIG. 5 shows a decentered cylindrical mirror 15 which is connected to the intermediate ring 32 with pairwise obliquely placed spring lugs 25. The rigid intermediate ring is coupled to the mount 55 by means of the monolithic joints 452, 453 and the lever 451. The actuator 45 thus acts on the intermediate ring 32 (e.g., piezoelectrically, or by means of an expansion element controlled by a Peltier element, cf. European Patent EP 0 145 902 A via the lever mechanism 451, 452, 453 with a reduction ratio.

Figure 6:
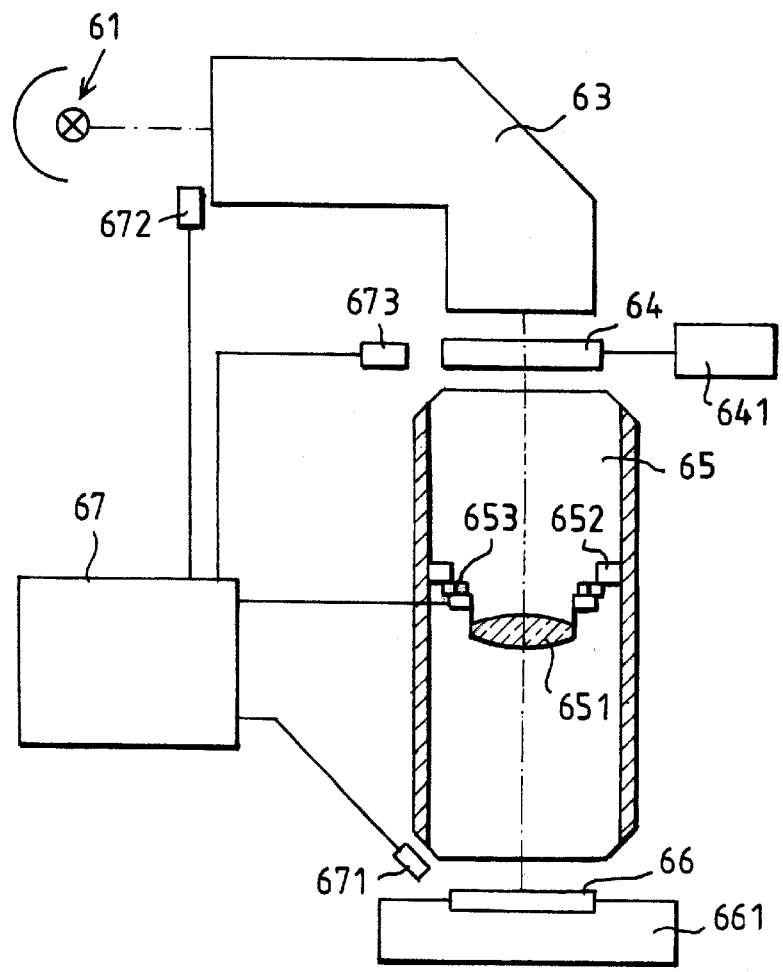
FIG. 6 shows a projection exposure device, schematically.

Finally, FIG. 6 shows in a further embodiment the accommodation of a lens 651, arranged in a mount 652 according to the invention, in an objective 65, which as a projection objective is a part of a microlithography projection exposure device. This consists, as is known, of a light source 61, an illumination system 63, a mask 64 with a positioning system 641, the objective 65, the wafer 66 and its positioning system 661.

As a rule several lenses are of course mounted according to the invention in the objective 65, or in a catadioptric or catoptric objective, also with one or more mirrors. Only one of these is shown here for the sake of clarity. This mounting technique can likewise naturally find application in the illumination system 63.

A control system 67 of the projection exposure device, with sensors 671, 672, 673, controls the actuators 653 on the mount 652.

Dependent on the image parameters (sensor 671) such as focal position, wavefront, and the like, on illumination parameters (sensor 672) such as pulse duration, number, illumination setting such as degree of coherence, quadrupole illumination, and/or on parameters of the mask (sensor 673), the control system 67 controls the optimum image quality by controlling the actuators 653, and if necessary the actuators of other optical elements, and as a rule data fields and calibration parameters stored in the control system 67 find application in this.

What is claimed is:

1. An assembly comprising:
   an optical element
   a mount,
   a plurality of lugs,
   a rigid intermediate ring,
   one of adjusting members and passive decouplers, and
   a housing,
   in which said optical element is coupled by said lugs to said rigid intermediate ring, said rigid intermediate ring being connected by said adjusting members or said passive decouplers to said mount for connection to at least one of said housing or further mounts.

2. The assembly according to claim 1, in which said lugs comprise spring joints.

3. The assembly according to claim 2, in which said spring joints comprise leaf springs.

4. The assembly according to claim 1, further comprising a material connection connecting said lugs to said optical element.

5. The assembly according to claim 4, in which said material connection is resistant to ultraviolet radiation.

6. The assembly according to claim 5, in which said material connection is resistant to ultraviolet radiation at wavelengths below 300 nm.

7. The assembly according to claim 5, in which said optical element comprises glass or crystal, said lugs comprise metal, and said material connection is free from organic constituents.

8. The assembly according to claim 7, in which said material connection is welded.

9. The assembly according to claim 8 in which said material connection is welded by one of diffusion welding or ultrasonic welding.

10. The assembly according to claim 7, in which said material connection is soldered.

11. The assembly according to claim 1, in which said lugs form a one-piece body with said intermediate ring.

12. The assembly according to claim 1, in which said lugs are materially coupled to said intermediate ring.

13. The assembly according to claim 12, in which coupling of said lugs to said intermediate ring is resistant to ultraviolet radiation.

14. The assembly according to claim 13, in which said coupling is resistant to ultraviolet radiation at wavelengths below 300 nm.

15. The assembly according to claim 13, in which said coupling is free from organic constituents.

16. The assembly according to claim 15, in which said coupling is welded.

17. The assembly according to claim 16, in which said coupling is laser welded.

18. The assembly according to claim 1, in which said adjusting members comprise one of piezoelements and Peltier elements.

19. The assembly according to claim 1, in which said passive decouplers include monolithic joints.

20. The assembly according to claim 1, in which said optical element has a rotationally symmetrical edge with a symmetry axis.

21. The assembly according to claim 20, in which said intermediate ring is rotationally symmetrical with respect to said symmetry axis.

22. The assembly according to claim 20, in which said lugs are arranged symmetrically with respect to planes containing said symmetry axis.

23. The assembly according to claim 20, in which said lugs are uniformly distributed over the periphery of said optical element.

24. The assembly according to claim 1, in which said optical element has a main plane that intersects the edge of said optical element with a closed curve.

25. The assembly according to claim 24, in which said lugs are arranged substantially perpendicularly to said main plane.

26. The assembly according to claim 25, in which said lugs are arranged substantially in said main plane radially of said edge of said optical element.

27. The assembly according to claim 1, in which said lugs (22) are arranged substantially tangentially to the edge of said optical element.

28. The assembly according to claim 1, in which the lowest characteristic frequency of mechanical vibrations experienced by said optical element is greater than about 200 Hz.

29. The assembly according to claim 28, in which the lowest characteristic frequency of mechanical vibration is greater than about 300 Hz, up to about 1 KHz.

30. The assembly according to claim 1, in which the astigmatic and three-waiveness deformation of said optical element is less than about 30 nm.

31. The assembly according to claim 1, in which said mount has a seating surface, and deformation of said seating surface is decoupled to the extent of over 95% from said optical element.

32. The assembly according to claim 1, in which at least some of said adjusting members are of passive construction.

33. An objective including at least one assembly according to claim 32, wherein said adjusting members of passive construction serve for adjustment of said optical element relative to a reference located outside of said objective.

34. An objective including at least one assembly according to claim 32, wherein said adjusting members of passive construction serve for adjustment of said optical element during production adjustment of said objective.

35. A projection exposure device for microlithography containing at least one assembly according to claim 1, further comprising at least one actuator, and a control circuit that drives said at least one actuator.

36. An objective including at least one assembly comprising:

an optical element a mount, a plurality of lugs, a rigid intermediate ring, one of adjusting members and passive decouplers, and a housing, in which said optical element is coupled by said lugs to said rigid intermediate ring, said rigid intermediate ring being connected by said adjusting members or said passive decouplers to said mount for connection to at least one of said housing or further mounts.

37. A microlithography projection exposure device including at least one assembly comprising:

an optical element a mount, a plurality of lugs, a rigid intermediate ring, one of adjusting members and passive decouplers, and a housing, in which said optical element is coupled by said lugs to said rigid intermediate ring, said rigid intermediate ring being connected by said adjusting members or said passive decouplers to said mount for connection to at least one of said housing or further mounts.

* * * * *